United States Patent
Sundaram et al.

(10) Patent No.: US 7,291,858 B2
(45) Date of Patent: Nov. 6, 2007

(54) QWIP WITH TUNABLE SPECTRAL RESPONSE

(75) Inventors: Mani Sundaram, Nashua, NH (US); Axel R Reisinger, Milford, NH (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 162 days.

(21) Appl. No.: 10/829,574

(22) Filed: Apr. 22, 2004

(65) Prior Publication Data

US 2004/0195509 A1    Oct. 7, 2004

Related U.S. Application Data

(63) Continuation-in-part of application No. 10/781,523, filed on Feb. 18, 2004, now Pat. No. 7,238,960, application No. 10/829,574, which is a continuation-in-part of application No. 09/746,956, filed on Dec. 22, 2000, now Pat. No. 6,875,975.

(60) Provisional application No. 60/173,077, filed on Dec. 24, 1999.

(51) Int. Cl.
    *H01L 31/0304*      (2006.01)
(52) U.S. Cl. .................. 257/21; 257/184; 257/189; 257/440; 257/E31.033
(58) Field of Classification Search ............... 257/21, 257/189, 440, 444
See application file for complete search history.

(56) References Cited

U.S. PATENT DOCUMENTS

| | | |
|---|---|---|
| 5,229,614 A | 7/1993 | Andersson et al. |
| 5,355,000 A | 10/1994 | Delacourt et al. |
| 5,384,469 A | 1/1995 | Choi |
| 5,385,632 A | 1/1995 | Goossen |
| 5,539,206 A | 7/1996 | Schimert |
| 5,546,209 A | 8/1996 | Willner et al. |
| 5,552,603 A | 9/1996 | Stokes |
| 5,568,574 A | 10/1996 | Tanguay, Jr. et al. |
| 5,751,830 A | 5/1998 | Hutchinson |

(Continued)

FOREIGN PATENT DOCUMENTS

WO    WO 98/09141    3/1998

OTHER PUBLICATIONS

Almogy, Gilad, et al., "Monolithic integration of quantum well infrared photodetector and modulator", Appl. Phys. Lett., Apr. 8, 1996, pp. 2088-2090, vol. 68 No. 15, American Institute of Physics.

(Continued)

*Primary Examiner*—Jerome Jackson, Jr.
(74) *Attorney, Agent, or Firm*—Vern Maine & Associates

(57) ABSTRACT

A tunable QWIP FPA device that is configured for spectral tunability for performing the likes of imaging and spectroscopy is disclosed. A selected bias voltage is applied across the contacts associated with a particular detector layer/channel of the device, where each applied bias corresponds to a particular target spectrum/color for detection. Each detector layer/channel can be coarse tuned for a bimodal or dual-band operation (e.g., MWIR/LWIR). Also, each detector layer/channel is configured for continuous or fine tuning within a particular mode (e.g., MWIR/MWIR). Thus, dynamic bias-controlled tuning is enabled. Asymmetric quantum well configurations enable this tunability.

17 Claims, 8 Drawing Sheets

U.S. PATENT DOCUMENTS

| | | | |
|---|---|---|---|
| 5,818,051 | A | 10/1998 | Dreiske et al. |
| 5,909,303 | A | 6/1999 | Trezza et al. |
| 5,959,339 | A | 9/1999 | Chapman et al. |
| 6,005,262 | A | 12/1999 | Cunningham et al. |
| 6,091,126 | A | 7/2000 | Costard et al. |
| 6,104,046 | A | 8/2000 | Borenstain |
| 6,184,538 | B1 | 2/2001 | Bandara et al. |
| 6,469,358 | B1 * | 10/2002 | Martin ................ 257/440 |
| 6,495,830 | B1 | 12/2002 | Martin |
| 6,498,346 | B1 | 12/2002 | Martin |
| 6,531,700 | B1 | 3/2003 | Brown et al. |
| 6,561,693 | B1 | 5/2003 | Martin |
| 6,818,917 | B2 * | 11/2004 | Kuan et al. ............ 257/21 |

OTHER PUBLICATIONS

Vaya, P.R. et al. "Study of Voltage Tunable Asymmetric Quantum Well Structure For Infrared Detection", 2004, pp. 1-5, Nano Science and Technology Institute.

Marsan, Ajome M. et al, "Modelling Slotted Multi-Channel Ring All-Optical Networks", IEEE, 1997, pp. 146-153.

Marsan, Ajome M. et al, "Access Protocols for Photonic WDM Multi-Rings with Tunable Transmitters and Fixed Receivers", SPIE, vol. 26921, pp. 59-72, no date.

Beckmann, Carl, "Applications: Asynchronous Transfer Mode and Synchronous Optical Network", Handbook of Fiber Optic Data Communication, 1998, pp. 385-414, Academic Press.

Ross, Floyd E., "An Overview of FDDI: The Fiber Distributed Data Interface", IEEE Journal on Selected Areas in Communications, Sep. 1989, pp. 1043-1051, vol. 7 No. 7.

Gunapala et al., "15-um 128 × 128 GaAs / AlxGal-xAs Quantum Well Infrared Photodetector Focal Plane Array Camera", IEEE Transactions on Electron Devices, Jan. 1997, pp. 45-50, vol. 44 No. 1.

Tidrow et al., "Granting coupled multicolor quantum well infrared photodetectors", Appl. Phys. Lett., Sep. 25, 1995, pp. 1800-1802, vol. 67 No. 13.

Andersson et al., "Grating-coupled quantum-well infrared detectors: Theory and performance", J. Appl. Phys., Apr. 1, 1992, pp. 360-3610, vol. 71 No. 7.

PCT International Search Report dated Mar. 8, 2001 of International Appl. No. PCT/US00/35762 filed Dec. 12, 2000.

PCT International Search Report dated Mar. 8, 2001 of International Appl. No. PCT/US00/35162 filed Dec. 22, 2000.

Andersson et al., "Grating-coupled quantum-well infrared detectors: Theory and performance", J. Appl. Phys., Apr. 1, 1992, pp. 3600-3610, vol. 71 No. 7.

Marsan, Ajmone M. et al, "Modelling Slotted Multi-Channel Ring All-Optical Networks", IEEE, 1997, pp. 146-153, no date.

Marsan, Ajmone M. et al, "Access Protocols for Photonic WDM Multi-Rings with Tunable Transmitters and Fixed Receivers", SPIE, vol. 2692, pp. 59-72.

Beckmann, Carl, "Applications: Asynchronous Transfer Mode and Synchronous Optical Network", Handbook of Fiber Optic Data Communication, 1998, pp. 385-414, Academic Press.

Ross, Floyd E., "An Overview of FDDI: The Fiber Distributed Data Interface", IEEE Journal on Selected Areas in Communications, Sep. 1989, pp. 1043-1051, vol. 7 No. 7.

Gunapala et al., "15-um 128 × 128 GaAs / AlxGal-xAs Quantum Well Infrared Photodetector Focal Plane Array Camera", IEEE Transactions on Electron Devices, Jan. 1, 1997, pp. 45-50, vol. 44 No. 1.

Tidrow et al., "Grating coupled multicolor quantum well infrared photodetectors", Appl. Phys. Lett., Sep. 25, 1995, pp. 1800-1802, vol. 67 No. 13.

Sundaram, Mani and Reisinger, Axel, Avalanche QWIP, 7 pgs., no date.

Sundaram, Mani and Reisinger, Axel, Tunable QWIP with Asymmetic Quantum Wells, 7 pgs., no date.

Sundaram, Mani and Reisinger, Axel, Bimodal QWIP with Coupled Quantum Wells, 8 pgs., no date.

Sundaram, Mani and Reisinger, Axel, Blocked Superlattice Miniband QWIP with/without Graded Barriers, 8 pgs., no date.

Sundaram, Mani and Reisinger, Axel, Tunable Multi-Color QWIP, 7 pgs., no date.

Sundaram, Mani and Reisinger, Axel, Rotated Waffle-Grating Optical Coupler for QWIPs, 14 pgs., no date.

Sundaram, Mani and Reisinger, Axel, Hybrid Metal Optical Coupler for QWIPs, 7 pgs., no date.

Sundaram, Mani and Reisinger, Axel, Photon-in-Box QWIP, 9 pgs., no date.

* cited by examiner

QWIP WITH TUNABLE SPECTRAL RESPONSE

RELATED APPLICATIONS

This application is a continuation-in-part of U.S. patent application Ser. No. 09/746,956, filed Dec. 22, 2000 now U.S. Pat No. 6,875,975, which claims the benefit of U.S. Provisional Application No. 60/173,077, filed Dec. 24, 1999. This application is also a continuation-in-part of U.S. patent application Ser. No. 10/781,523, filed Feb. 18, 2004 now U.S. Pat. No. 7,238,960. Each of these applications is herein incorporated in its entirety by reference.

FIELD OF THE INVENTION

The invention relates to quantum well infrared photodetector (QWIP) technology, and more particularly, to a tunable QWIP focal plane array capable of multiple dual-band imaging.

BACKGROUND OF THE INVENTION

A quantum well designed to detect infrared (IR) light is called a quantum well infrared photodetector (QWIP). QWIPs operate by photo-excitation of electrons between a ground state and an excited state of its quantum wells. In more detail, a quantum well absorbs IR photons. This absorption of IR photons photo-excite electrons from the ground state to the excited state of each quantum well. The excited states of the quantum wells making up a QWIP lie close to or within an energy transport band (sometimes referred to as the continuum or a miniband). A voltage externally applied to the QWIP operates to sweep out the photo-excited electrons, thereby producing a photocurrent in the continuum or miniband.

Quantum wells are grown in a crystal structure. In general, layers of two different, high-bandgap semiconductor materials are alternately grown. The bandgap discontinuity of the two semiconducting materials creates quantized subbands in the wells associated with conduction bands. Only photons having energies corresponding to the energy separation between the ground and excited states are absorbed. This is why a QWIP has such a sharply defined absorption spectrum. Note that each well can be shaped to detect a particular wavelength, and so that it holds the ground state near the well bottom, and the excited state near the well top.

A group of QWIPs can be used to form a focal plane array (FPA) in detection applications, where each QWIP effectively acts as a pixel of the array. Each QWIP structure is designed to produce a signal that is transmitted to a read out circuit. The group of the signals from all the pixels of the FPA can be used to produce an image corresponding to the received infrared radiation. In a multicolor application, the QWIP structures must be configured so that each desired color can be detected. Signals produced by the QWIPs must then be captured and processed so that images can be formed and displayed. Such functionality is not trivial, and is associated with a number of difficult implementation problems.

In addition, although various tunable absorption schemes have been developed, where the wavelength of absorption is tunable (e.g., such as those using asymmetric quantum wells), there appears to be no device that is capable of tunability at the FPA level for performing the likes of target imaging. In particular, it would be highly desirable to have a multicolor, multifocal plane optical detector device that has a spectral response tunable at both a coarse tuning level (e.g., switch between two spectral bands, such as from mid-wavelength to long-wavelength) and a fine tuning level (e.g., within one spectral band, such as from mid-wavelength to mid-wavelength).

The tunable detector would ideally be a monolithic or unitary device that can be fabricated by conventional epitaxial growth techniques on a single substrate with a sufficient number of contacts suitable for direct, discrete, pixel to readout integrated circuit (ROIC) connection and direct current readout for each detected wavelength, and that can be easily scaled up to large array configurations suitable for the many applications for which such a device would be attractive.

What is needed, therefore, is a QWIP FPA design that is configured for spectral tunability for performing the likes of imaging and spectroscopy.

BRIEF SUMMARY OF THE INVENTION

One embodiment of the present invention provides a tunable quantum well infrared photodetector focal plane array (QWIP FPA) imaging device. The device includes one or more detector layers configured with asymmetric quantum wells. Each detector layer is between contact layers, thereby defining a stack of layers having a front side and a back side. Each detector layer has a spectrum of light absorption that changes in response to an applied bias. Thus, each detector layer can effectively operate as a tunable channel. For example, applying a first bias causes a first spectrum of absorption to be dominant and applying a second bias causes a second spectrum of absorption to be dominant. A light-coupling grating is formed on the backside of the stack. The grating has a pattern that reflects a substantial portion of incoming light so as to disperse that light through the one or more of the detector layers, thereby facilitating absorption. A reflective coating on the sides of the detector layers provides, in conjunction with the light-coupling grating, a photon-in-a-box configuration for containing light. Note that the stack of layers can be one multicolor pixel of the device that is repeated a number of times, thereby defining an array of the multicolor pixels.

Each detector layer can be configured to have a thickness of about one micron or less. The device may further include a read-out integrated circuit (ROIC) that includes biasing circuitry adapted to deliver bias signals to each detector layer thereby enabling tunability of the corresponding spectrum of light absorption. Coarse tuning could be used, for example, to cause bimodal spectral shifts (e.g., from mid-wavelength IR to long-wavelength IR), while fine tuning could be used to cause smaller spectral shifts within a particular mode (e.g., for spectroscopy applications). In one particular such embodiment, each contact layer of the device is electrically coupled to a backside contact, thereby facilitating connection to the ROIC. The ROIC may further include an image processor adapted to receive pixel data from each detector layer and to generate corresponding images associated with the pixel data. In another such embodiment, each asymmetric quantum well is a unit cell comprising two quantum wells coupled by a barrier. One of the quantum wells is configured to absorb a first spectrum, and the other quantum well is configured to absorb a second spectrum. Applying a first bias causes the first spectrum to be dominant and applying a second bias causes the second spectrum to be dominant. The quantum well configured to absorb the second spectrum may include a well spike, which effectively raises the ground state of that well.

Another embodiment of the present invention provides a tunable quantum well infrared photodetector focal plane array (QWIP FPA) imaging device. This particular embodiment includes one or more detector layers each including a plurality of asymmetric unit cells. Each unit cell includes two quantum wells coupled by a barrier. One of the quantum wells is configured to absorb a first spectrum in response to a first bias being applied, and the other quantum well includes a well spike and is configured to absorb a second spectrum in response to a second bias being applied. Each detector layer is between contact layers, thereby defining a stack of layers having a front side and a back side.

The device may further be configured with a read-out integrated circuit (ROIC) that includes biasing circuitry adapted to deliver the first and second bias signals to each detector layer, thereby enabling spectral tunability of the device. Each contact layer of the device can be electrically coupled to a backside contact, thereby facilitating connection to the ROIC. The ROIC may further include an image processor adapted to receive pixel data from each detector layer, and to generate corresponding images associated with the pixel data. Note that the stack of layers can be one multicolor pixel of the device, and repeated a number of times thereby defining an array of the multicolor pixels. Each pixel can provide pixel data to the image processor.

Another embodiment of the present invention provides a tunable quantum well infrared photodetector focal plane array (QWIP FPA) imaging device. This particular device has one or more detector layers including asymmetric quantum wells. Each detector layer has a spectrum of light absorption that changes in response to an applied bias. For example, applying a first bias causes a first spectrum of absorption to be dominant and applying a second bias causes the second spectrum of absorption to be dominant. In addition, each detector layer is between contact layers, thereby defining a stack of layers having a front side and a back side. The device is further configured with a read-out integrated circuit (ROIC) that includes biasing circuitry adapted to deliver bias signals to each detector layer thereby enabling spectral tunability. An image processor is adapted to receive pixel data from each detector layer and to generate corresponding images associated with the pixel data. Note that the stack of layers can be one multicolor pixel of the device, and repeated a number of times thereby defining an array of the multicolor pixels, from each of which the image processor receives pixel data.

In one specific embodiment, each asymmetric quantum well is a unit cell comprising two quantum wells coupled by a barrier. One of the quantum wells is configured to absorb a first spectrum, and the other quantum well includes a well spike and is configured to absorb a second spectrum. In such a case, a first bias can be applied to cause the first spectrum to be dominant, and a second bias can be applied to cause the second spectrum to be dominant.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention provide a tunable QWIP FPA device that is configured for multi-modal and spectral tunability for performing the likes of imaging and spectroscopy. A selected bias voltage is applied across the contacts associated with a particular detector layer or "channel" of the device, where each applied bias corresponds to a particular target spectrum for detection. Each detector layer has a spectral response that can be coarse tuned for a bimodal or dual-band operation (e.g., MW/LW). Also, each detector layer is configured for continuous or fine tuning within a particular mode (e.g., MW/MW). Thus, dynamic bias-controlled tuning is enabled.

The tunable QWIP FPA can be fabricated as a multifocal plane imaging device using conventional epitaxial growth techniques on a substrate. Back side contacts can be used to enable direct, discrete, pixel to ROIC connection and direct current readout for each detected wavelength (i.e., per channel). Each detector layer/channel of the detector can be dedicated to sensing a particular spectrum or spectral band. In addition, note that any one spectrum can be dominant while other spectra are effectively dormant. Alternatively, simultaneous biasing can be applied thereby enabling the detection of corresponding multiple spectra at the same time (one spectrum per each detector layer/channel).

The tunable detector can be scaled up to large array configurations suitable for the many imaging applications.

General QWIP Structure

Figure 1:
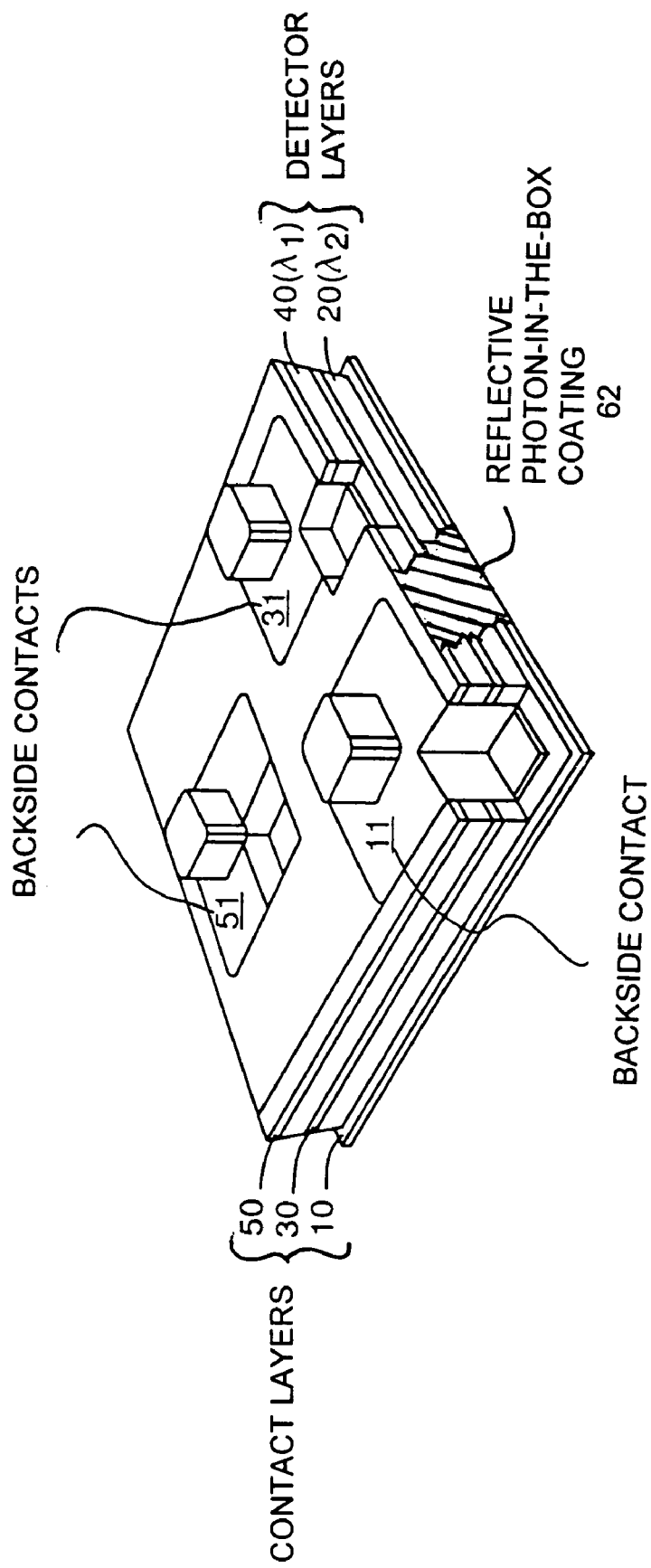
FIG. 1 is a partially cut-away perspective view of a 2-channel QWIP FPA device configured in accordance with one embodiment of the present invention.

FIG. 1 is a partially cut-away perspective view of a light detector device configured in accordance with one embodiment of the present invention. As can be seen, this example light detector device is configured with multiple layers of semiconductor materials designed for detecting light at two different wavelengths, $\lambda_1$ and $\lambda_2$. In particular, the device includes two layers 20 and 40 of detector semiconductor material, each with a different light absorption spectrum. Layer 40 detects $\lambda_1$ and layer 20 detects $\lambda_2$. In addition, note the contact layers 10, 30 and 50 of semiconductor material, which are electrically coupled to the backside contacts 11, 31, and 51 respectively, by metalized conductor strips. The backside connections are provided for applying detector bias and individual detector current readouts which are electrically coupled via bumps to the ROIC substrate (not shown). A reflective coating 62 can be provided on the side of the detector layers to provide a photon-in-a-box effect, to contain light within the detection area as explained herein.

It will be appreciated that although this embodiment is capable of simultaneously detecting multiple wavelengths of light on a pixel-registered basis, other embodiments may be configured to detect a single wavelength. Thus, the layers of the QWIP structure or "photodetector" may vary depending on the particular application. For example, a single wavelength detector might have only one detection layer and two contact layers (one well contact and one common contact).

The structure can be created by conventional epitaxial growth of the various layers of semiconductor material upon a semiconductor substrate followed by selective removal of material using various etch techniques (wet and dry) to create the plateau-shaped device. The specific semiconductor materials used depend on the specific wavelengths to be detected. Binary and ternary compounds such as GaAs and AlGaAs, and quaternary compounds such as GaInAsP, can be used for fabrication of the device layers.

The semiconductor materials of the detector layers 20 and 40 may be interband materials, where the layers are deposited in order from top to bottom of the photodetector by their respective response curves for detecting from longer to shorter wavelengths of light. Note that such a configuration is not a QWIP structure, and is more correctly referred to in general as a detection device. The interband materials may include, for example, elements from among Groups II, III, IV, V and VI of the periodic table, such as GaAs, AlGaAs, and GaInAsP. Such an interband configuration allows for multiple color detection, in that each layer is specifically fabricated to detect a particular color. In this sense, the detector's spectral response is static.

In alternative embodiments, the semiconductor materials of layers 20 and 40 may be quantum-well inter-sub band material systems, from among Groups II, III, IV, V and VI from the periodic table (e.g., GaAs/AlGaAs and AlGaAs/InGaAs). Multiple sets of detector layers can be stacked on top of each other to form the sensor area of the QWIP structure. Here, the type of quantum well used determines whether the detector's spectral response is static or tunable. If symmetric quantum wells are used, then quantum mechanic selection rules dictate a static spectral response. However, asymmetric wells allow for tunability.

The contact layers 10, 30, and 50 of the QWIP FPA structure can each be implemented, for example, as n—GaAs, with contact points covered in gold or palladium.

In a multiple wavelength configuration having multiple detector layers, an edge connector can be included for providing the detector bias voltage, given limitations in the ability to fabricate posts and vias in proportionally thicker devices. Alternatively, a backside bias connection can be provided in the same plane as the detector signal contacts where the detector layers and contact layers are relatively thin (e.g., about one micron thick). This permits the etching of vias and wells sufficiently deep to reach the contact layers but still sufficiently small in width and cross-section to allow room for several contacts within the pixel surface area. Metal conductive strips can be used to electrically couple the contact layers to their backside surface pads.

Figure 2:
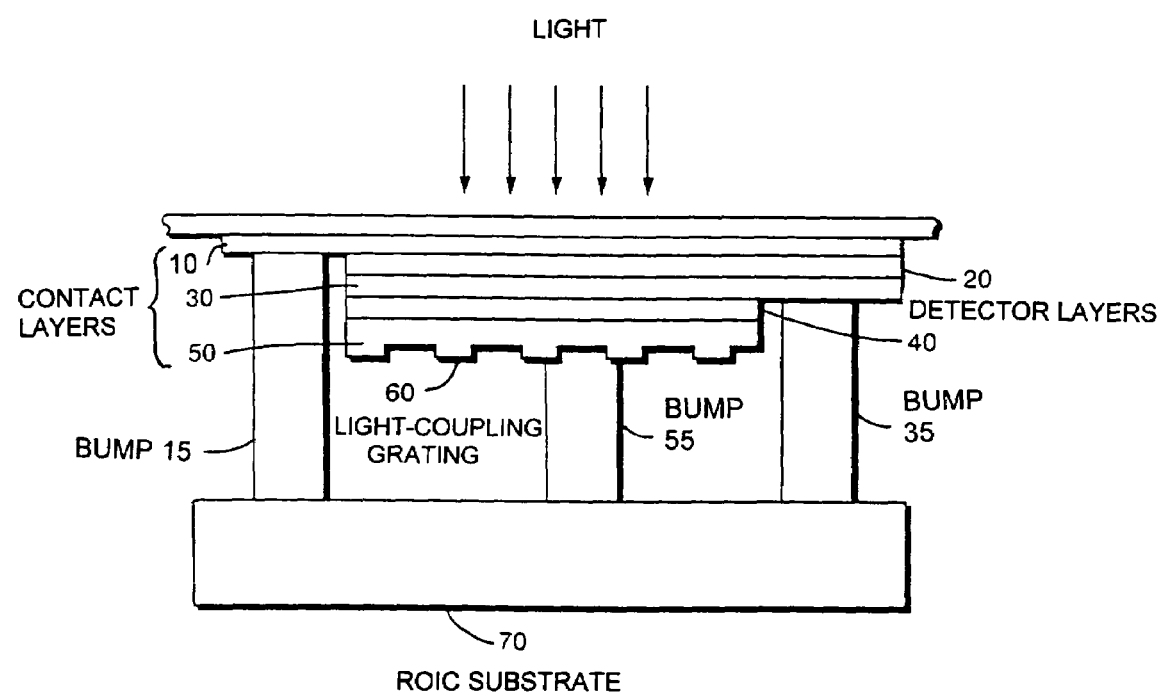
FIG. 2 is a cross-section view of the device shown in FIG. 1.

FIG. 2 is a cross-section view of the device shown in FIG. 1, and illustrates the contact layers 10, 30, and 50, and light detection layers 20 and 40. Also illustrated is a light-coupling grating 60 and interconnect bumps 15, 35, 55 used to electrically and mechanically couple the QWIP structure to a read out integrated circuit (ROIC) substrate 70. The three interconnect bumps 15, 35, 55 in this particular case couple the contacts for each of the detector layers 20 and 40, as well as the contact for the detector common. These bumps 15, 35, 55 can be implemented, for example, with In or an Indium-compound. Note that the QWIP structure is shown as inverted after the hybridization process, where the QWIP structure is electrically and mechanically coupled with the ROIC substrate 70.

In operation, a detector bias voltage ($V_{DB}$) can be applied to one or both backside contacts 11 and 51 with reference to backside contact 31. For simplicity, note that the backside contacts 11, 31, 51 are electrically coupled to corresponding bumps 15, 35, and 55. Application of a detector bias voltage produces an electrical bias across the corresponding detector layers 20 and 40. In static or non-tunable configurations, formed using symmetric quantum wells, changes in the bias applied to each contact do not cause changes in the spectral response. In tunable configurations, formed using inter-sub band material systems and asymmetric quantum wells, this bias applied to each contact can be different, and changes in the bias cause spectral shifts.

In a QWIP FPA having a tunable spectral response, the composition of the two photo detecting layers 20 and 40 and the structure of their asymmetric wells are chosen so that when light passes into the sensing area, the respective layers selectively absorb target wavelengths of interest based on the bias applied, while remaining transparent to other wavelengths. Absorption of the target wavelength of light energy modulates current in the corresponding detector layer. This current from each detector layer can then be measured separately and simultaneously by the ROIC present on substrate 70. The equivalent electrical schematic of FIG. 2 is depicted in FIG. 3.

The light-coupling grating 60 is etched or otherwise formed on the top of the final or backside contact layer 50. This grating 60 has a pattern that reflects a substantial portion of the light coming straight into the detector in a direction normal to the path of entry, dispersing it through detector layers 20 and 40 so as to maximize the exposure of the detector layer's semiconductor materials to the light. A photon box configuration can also be provided (where detector layer sides are coated with a reflective material 62, such as gold, as shown in FIG. 1) to further reflect light that is dispersed substantially parallel to the focal plane, thereby preventing that dispersed light from escaping out the sides of the detector area.

The geometry and orientation of the pattern of grating 60, including the size, height, and spacing of the steps or wells of the grating 60, is optimized for the center wavelength of interest. In one particular embodiment, the depth or relief of the etching is one quarter wavelength of the wavelength of interest, while the spacing or pitch of the lines of the pattern is a wavelength in each direction. Also, the orientation of the grating 60 with respect to the pixel axes is about 45 degrees, but can range from about 20 to 70 degrees. Some types of grating 60 are oriented at 0 degrees. Various configurations of grating 60 and other techniques for enhancing absorption capability and efficiency are discussed in more detail in the previously incorporated U.S. application Ser. No. 09/746,956, titled "Multi-Color, Multi-Focal Plane Optical Detector" and U.S. application Ser. No. 10/781,523, filed Feb. 18, 2004, and titled "QWIP with Enhanced Optical Coupling."

Figure 3:
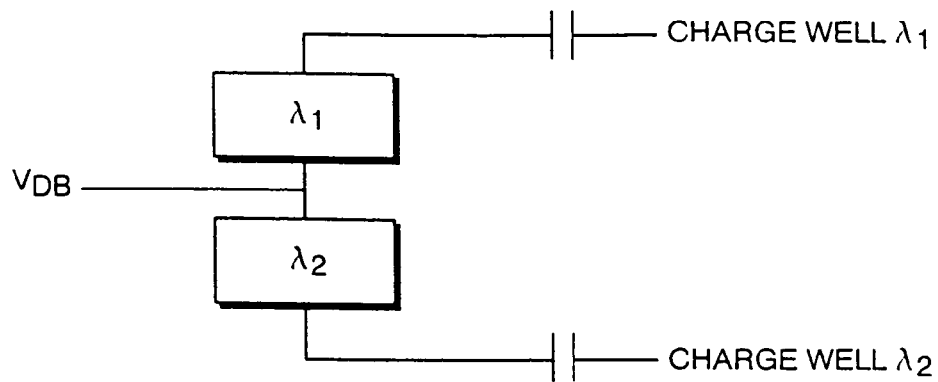
FIG. 3 is a simplified electrical schematic of the device shown in FIG. 1.

FIG. 3 is a simplified electrical schematic of the embodiment of FIG. 1, illustrating the device's ability to detect two wavelengths of light. In this particular example, the detector bias voltage $V_{DB}$ is applied to contacts 11 and 51 with respect to contact 31. Each detector layer, 20 and 40, absorbs the particular wavelength of light for which it was designed. This absorption modulates the current passing through the detector layer caused by the applied voltage bias. As previously stated, the applied bias may be different for each detector layer, and may be varied to effect both coarse and fine tuning of the spectral response (assuming asymmetric quantum well designs). The total current through each detector is separately collected by the readout integrated circuit and measured. This measured current is proportional to the amount of light absorbed by the associated detector.

In one embodiment, the ROIC substrate 70 is configured to measure the current from one detector layer at a time, switching rapidly between detector layers λ1 and λ2 to perform each measurement. In an alternative embodiment, the ROIC substrate 70 is configured to measure currents from both detector layers λ1 and λ2 simultaneously. Various multiplexing and signal processing schemes can be employed by ROIC substrate 70.

As previously stated, QWIP FPA structures configured in accordance with the principles of the present invention can be designed to detect one to many wavelengths simultaneously. For example, the two detector layer embodiment shown in FIGS. 1 and 2 can be extended by adding detection layers and backside contacts to accommodate four or more discrete detector layers within each pixel.

Absorption Spectra

Figure 4:
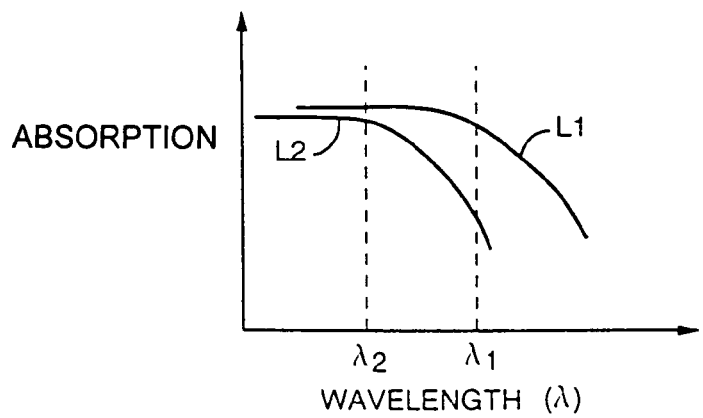
FIG. 4 is a graph illustrating the relationship between absorption and increasing wavelength for interband materials.

There are two general types of absorption spectra seen in the materials that can be used to produce the photodetectors configured in accordance with the principles of the present invention. First, there are interband materials, such as GaAs, InSb, and HgCdTe, which are typically designed for the detection of near, mid-wave and long-wave infrared radiation, respectively. The relative absorption spectra for these materials appear as shown in FIG. 4. The two curves L2 and L1 represent the absorption coefficients as a function of wavelength (λ) of the materials contained in detector layers 20 and 40 shown in FIG. 1. In general, each curve shows a region of high absorption at shorter wavelengths $\lambda_2$, while at longer wavelengths $\lambda_1$, the absorption diminishes.

To build a multicolor detector out of this type of material requires that the absorption spectra center around the wavelengths of light for which detection is desired, here assumed to be $\lambda_1$, and $\lambda_2$. This selection ensures efficient absorption of light at the selected wavelengths. In this example, detector layer 20 of FIG. 1 would be used to detect $\lambda_2$, and detector layer 40 would be used to detect $\lambda_1$. In addition, note that the materials are layered in the detector in an order such that light passes through detector layer 20 first and then through detector layer 40. The reason for this is that since the absorption spectrum for the material of layer 40 contains a region of high absorption that includes $\lambda_2$, it would incorrectly filter $\lambda_2$ along with $\lambda_1$ if it were placed first in the path of incoming light.

Figure 5:
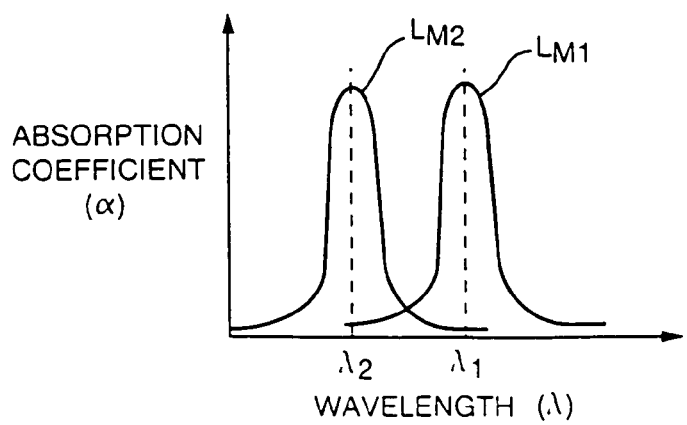
FIG. 5 is a graph of the absorption coefficient versus wavelength for the detection layers of the device shown in FIG. 1.

The second type of absorption spectrum is one seen in quantum-well inter-sub band material systems, such as GaAs/AlGaAs, AlGaAs/InGaAs, designed to detect mid- and far-infrared wavelengths. FIG. 5 shows schematic representations of the absorption curves $L_{M2}$ and $L_{M1}$ for any two different quantum-well, inter-sub band materials M2 and M1. Note that these spectra do not overlap each other in their respective $\lambda_2$ and $\lambda_1$ regions of high absorption. When two such materials are used to create a multicolor photodetector configured in accordance with an embodiment of the present invention, then it is not necessary to form the structure with the layer sequencing constraint necessary with interband absorption materials.

Vertically stacking relatively thin (e.g., one micron or less) detector layers in order of transparency, and using the light-coupling grating 60 and associated "photon box" techniques, allows each detector layer the maximum exposure area to the incoming light. This improves detector performance as well as the detector fill factor, which is the active optical detector area divided by the total area. Also, with data from a given pixel collected at the same time for each color of that pixel, combined with discrete pixel bias control, complex data processing at each pixel site is enabled, thereby advancing the integration of sensing and processing power. Bringing the bias contact as well as the readout contacts to the backside surface of the pixel for mating to the ROIC substrate as with flip-chip or other bonding techniques facilitates the manufacturing process.

Numerous potential applications for a detector configured in accordance with the principles of the present invention will be apparent in light of this disclosure. For example, with an array of dual-wavelength photodetectors, a network interconnect can be created whereby one wavelength transmits the data value while the other wavelength transmits the inverted data value. In this way, a differential optical signal can be transmitted, improving noise margin and extending the physical range of optical interconnects. Another application for the invention described herein is in vision systems where pixel-registered images in multiple wavelengths are useful, including weapons targeting, chemical analysis, medical imaging and diagnostics. Each pixel of the detector array may have a transparent face and a back side, where the back sides are all in a common plane to accommodate connection to a planar ROIC substrate using bump-bonding. In addition, each contact layer of each pixel may have a discrete electrical contact on the backside of the pixel, so that all the contacts are connectable to mating contacts on the planar substrate ROIC and other supporting electrical circuitry.

In such an embodiment, one contact layer of each pixel can be the final or capping contact layer that forms the back side. Alternatively, one contact layer of each pixel is proximate to the backside of the pixel due to having been coated (completely or partially) to insulate, reflect, or provide bumps or contacts and conductive leads to lower level contact layers. The outer surface of the final or capping contact layer may be etched in relief with a light-coupling grating pattern for reflecting light entering the pixel normal to the transparent face, so that the light will be substantially dispersed into the detector layers.

Multiple Dualband Imaging

Figure 6:
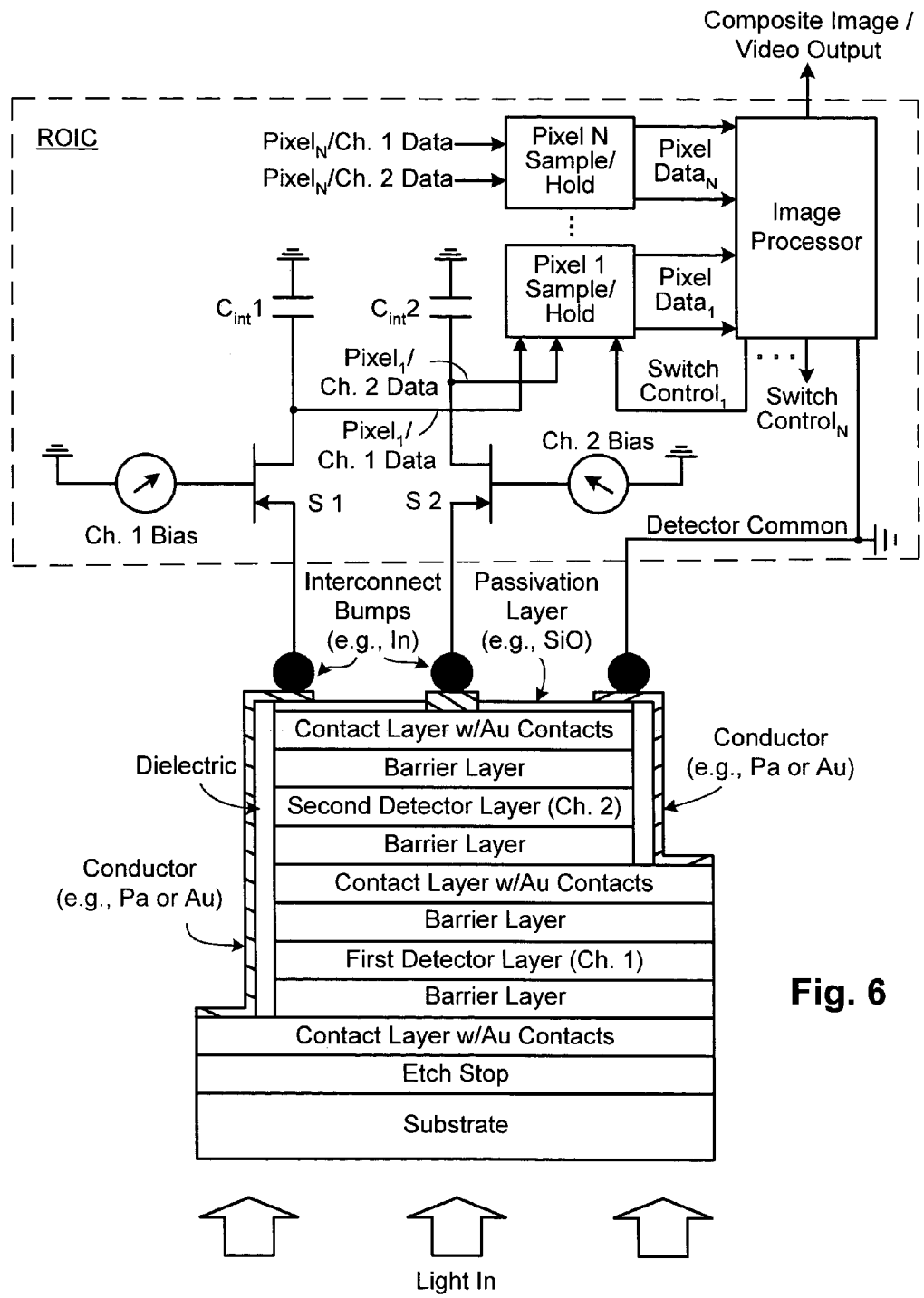
FIG. 6 is a side view and schematic of a tunable 2-channel QWIP FPA device configured in accordance with one embodiment of the present invention.

FIG. 6 is a detailed side structural view and schematic of a 2-channel QWIP FPA device configured in accordance with one embodiment of the present invention. As can be seen, there are two detector layers. Each detector layer includes a number of asymmetric quantum wells (e.g., 20 to 50 wells), and is sandwiched between a pair of barrier layers. A contact layer is electrically coupled with each detector layer. Also, a common contact layer (detector common) is provided. Note, however, that each detector layer could have its own common contact layer if so desired, which would require additional contact and barrier layers.

Each of the contact layers is electrically coupled to the backside of the structure by a conductor. Note that each of the detector layers is associated with a channel, so as to provide first and second channels. Further note, however, that each detector layer can be of the same construction (same asymmetric quantum well structures). Each channel is electrically coupled to a biasing circuit. The channel 1 biasing circuit includes a bias source, a FET switch (S1) and an integrating capacitor ($C_{int}1$), and the channel 2 biasing circuit includes a bias source, a FET switch (S2) and an integrating capacitor ($C_{int}2$). Pixel data from each channel is provided to a sample/hold circuit, and an image processor is provided to operate on the data from each pixel to form a video output.

Note that only one 2-channel pixel is shown, but N such pixels will generally be provided. For instance, in a 320×256 QWIP array, N would equal 81920. Other array configurations will be apparent in light of this disclosure.

In operation, each bias source is set to a particular DC voltage and held constant during an imaging session. As IR photons impinge on the detector and are absorbed into the asymmetric quantum wells, electrons are photo-excited from the ground state to an excited state of each well. Note that the excited state of an asymmetric well depends on the applied bias, which in turn determines the dominant spectrum of absorbed light. In this sense, the applied DC biases operate to sweep out the photo-excited electrons associated with a dominant or tuned spectrum in the form of a photocurrent. Further detail as to embodiments of asymmetric quantum wells and biasing schemes is provided in reference to FIGS. 7, 8a, and 8b.

The photocurrent generated by a particular channel charges the corresponding integrating capacitor. After a pre-set time, the imaging processor issues the "switch control$_1$" through "switch control$_N$" signals, which switches-in the sample/hold circuit, thereby causing the charge stored in each integrating capacitor to discharge into the sample/hold circuit. The discharged energy for each pixel is designated in FIG. 6 as "pixeln ch. 1 data" and "pixeln ch. 2 data", where n is the corresponding pixel number ranging from 1 to N. The pixel sample/hold circuits can be implemented, for example, individually or on a single chip using conventional technology (e.g., switching network and capacitors). Likewise, the entire ROIC functionality can be implemented as a purpose-built chip set or ASIC.

The pixel data$_{1-N}$ stored in the sample/hold circuit can then be provided to the image processor for any necessary processing, such as correlation, addition, subtraction, spectroscopy, and related algorithmic functions. Composite images or video is provided at the processor output, allowing for viewing on a display by an operator and/or additional analysis. Note that the composite images can be output to a memory for storage (e.g., as in a camera application). The image processor can be implemented, for example, with a microcontroller or other suitable processing environment that is configurable to receive pixel data$_{1-N}$, perform any necessary signal processing and analysis, and generate composite images. Conventional signal and imaging processing techniques can be employed here. Note that the processor can also be used to control the channel 1 and 2 bias voltages for each pixel.

During a conventional hybridization process, the ROIC and the QWIP FPA can be pressed together (with their individual interconnect bumps aligned) so that mechanical and electrical bonds are formed between the respective contacts of the ROIC and QWIP FPA. Note that an etch stop layer is provided in this example, which will facilitate removal of the substrate upon which the QWIP FPA structure is grown if so desired. A passivation layer is provided on the top contact layer in this example, but recall that a light-coupling grating can be provided to improve the detector's absorption and quantum efficiency.

The interconnect bumps in this example are In, the metal contacts are Au, and the conductors electrically and mechanically coupling the contact to the interconnect bumps are Pa. In this sense, the metal contacts are adapted to a common planar surface to enable bump-bonding. The contact layers can each be, for example, an n-GaAs layer. The barrier and etch stop layers can each be AlGaAs, and the substrate can be a GaAs or other infrared transparent substrate material. In such an embodiment, the detector layers can be configured with asymmetric GaAs quantum wells, doped as conventionally done. Other configurations will be apparent in light of this disclosure, and the present invention is not intended to be limited to any one such embodiment.

Note that each pixel has two channels. In this sense, each multicolor pixel is actually two co-located single color pixels. As explained herein, each single color pixel (i.e., each detector layer) can be tuned so that a particular spectrum of light is absorbed or dominant. Further note that each pair of co-located pixels included in an array can detect and measure at the same time. Thus, alignment and synchronization problems are avoided to provide perfect spatial and temporal registration.

Asymmetric Quantum Wells

Figure 7:
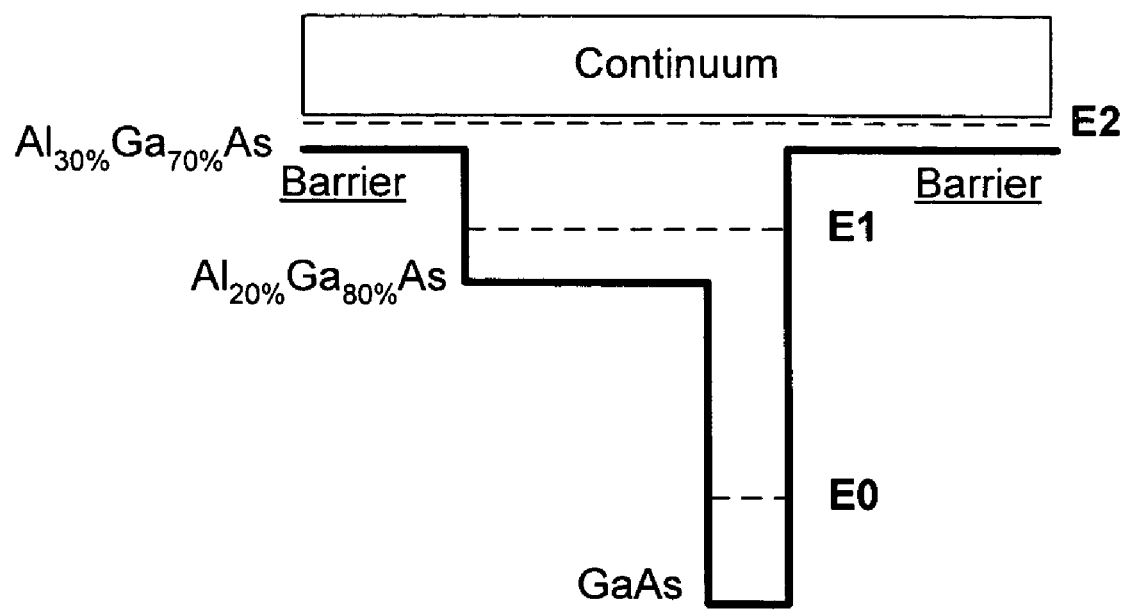
FIG. 7 illustrates an energy-level diagram of an asymmetric quantum well structure configured in accordance with one embodiment of the present invention.

FIG. 7 illustrates an energy-level diagram of an asymmetric quantum well structure configured in accordance with one embodiment of the present invention. As can be seen, this example asymmetric well has a ground state (E0), a first excited state (E1), and a second excited state (E2). Recall that, in a symmetric well, the quantum well selection rules dictate that only absorption from ground state to the first excited state is allowed, while absorption from ground state to second or additional excited states is prohibited. Thus, the spectral response of a symmetric well generally includes a single peak.

In an asymmetric well, however, absorption from the ground state to second, third, etc. excited states is allowed. For example, photons having a first energy (e.g., first spectrum or color of light) will be absorbed from ground state E0 to the first excited state E1, and photons having a second energy (e.g., second spectrum or color of light) will be absorbed from ground state E0 to the second excited state E2. Each of the absorbed spectra is associated with its own peak in the spectral response. In addition, a bias can be applied to determine which spectrum of light will be detected. In this sense, the bias determines the dominant spectrum of absorption, and can therefore be adjusted to tune the spectral response.

In the example shown in FIG. 7, the asymmetric well is GaAs and has a width that is thinner relative to the upper portion of the well. The upper portion of the well is wider and introduces about 20% of the barrier aluminum content ($Al_{20\%}Ga_{80\%}As$). The barriers sandwiching the asymmetric well are $Al_{30\%}Ga_{70\%}As$. As will be explained with reference to FIGS. 8a and 8b, absorption occurs from E0 to E1, or from E0 to E2, or some combination of E0 to E1 and E0 to E2. The dominant absorption detected depends on the bias applied.

Figure 8A:
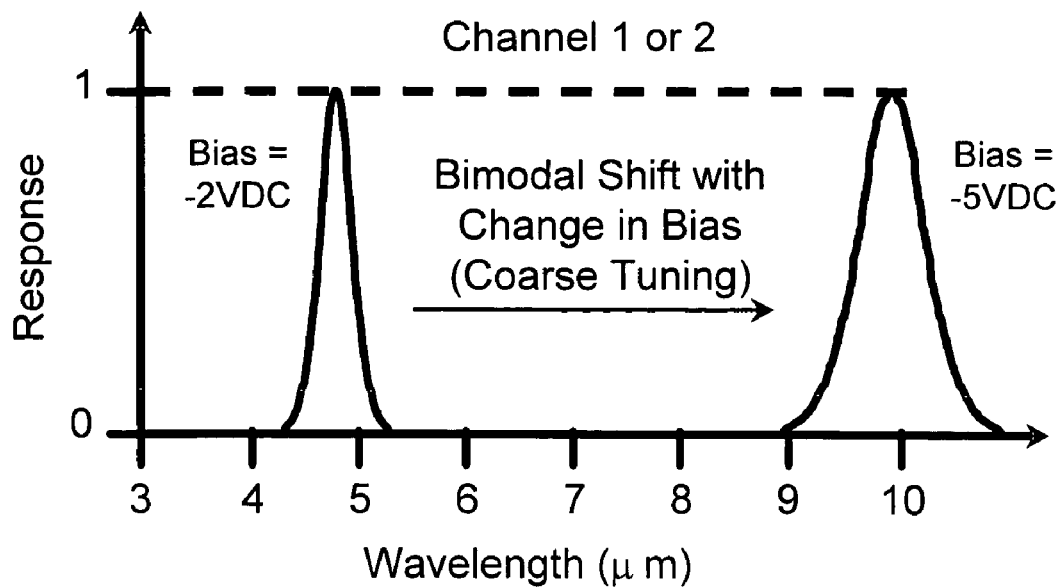
FIG. 8a illustrates the response of a tunable QWIP FPA having asymmetric quantum wells, where a bimodal spectral shift can be achieved with a change in bias in accordance with one embodiment of the present invention.

FIG. 8a illustrates the response of a QWIP FPA configured with asymmetric quantum wells. Here, photons at about 4.75 μm (+/−0.5 μm) are absorbed from the ground state E0 to the second excited state E2, and photons at about 10.0 μm (+/−1.0 μm) are absorbed from E0 to the first excited state E1. With no bias applied, the absorption spectrum would include both peaks, assuming both spectra of 4.75 μm and 10.0 μm light were received and absorbed. Of course, nothing would be detected, since a bias is needed to sweep the photoelectrons out to the contacts.

However, by applying a bias of, for example, −2 VDC, the spectrum of light that is detected is dominated by the photons at about 4.75 μm, because only electrons excited to the higher energy state E2 can be swept out of the quantum wells at this low bias. Then, by applying a higher bias of, for example, −5 VDC, the spectrum of light that is detected becomes dominated by the photons at about 10.0 μm, because now the electrons excited to the lower energy state E1 can also be swept out by this higher bias. This spectrum dominates because the absorption is higher in this spectral band to begin with. Thus, a bimodal shift (from mid-wavelength IR to long wavelength IR) in the spectral response of the QWIP FPA can be effected by changing the bias from −2 VDC to −5 VDC. Such a shift can generally be thought of as coarse tuning of the QWIP FPA spectral response. Note that intermediate biases such as −3 or −4 VDC will allow proportional detection of both spectra, although the response of one spectrum will be stronger than the other.

Figure 8B:
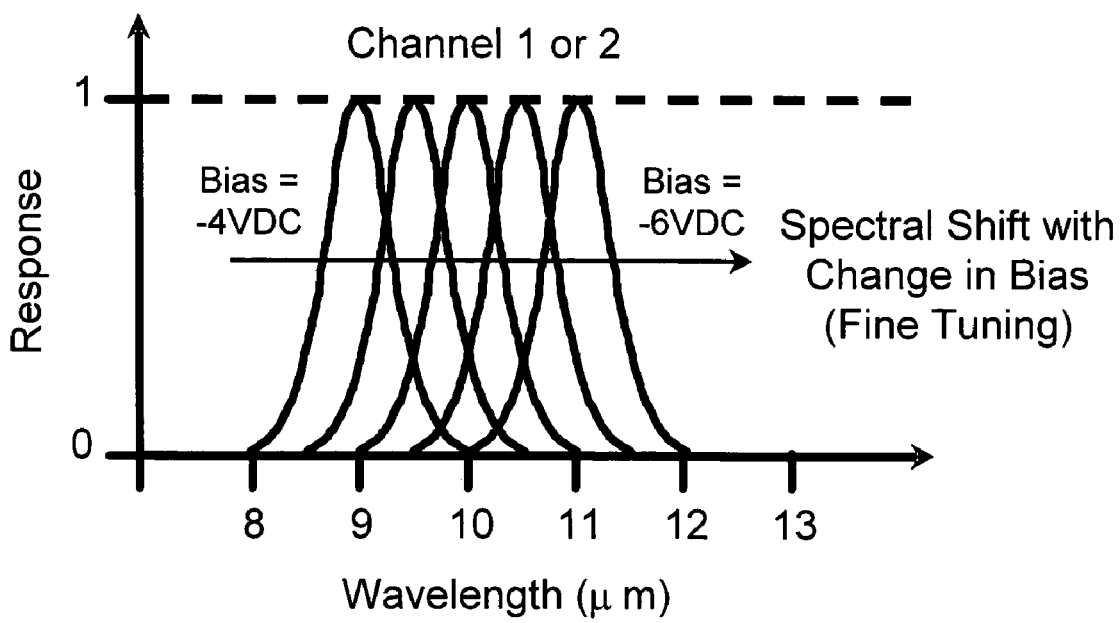
FIG. 8b illustrates the response of a tunable QWIP FPA having asymmetric quantum wells, where a spectral shift within a particular mode is achieved with a change in bias in accordance with one embodiment of the present invention.

In addition, and as shown in FIG. 8b, a spectral shift within a particular mode can also be achieved with a change in bias, thereby allowing for fine tuning. In this particular example, incrementally varying the bias from about −4 VDC to −6 VDC fine tunes the dominant spectrum that is absorbed, caused by finely tuning the energy level of the excited state E1. Such fine tuning enables, for example, spectroscopy applications within a particular mode, which in this case is the long wavelength IR range.

Thus, the biasing can be manually (e.g., by a user) or automatically (e.g., by a processor in the ROIC) set to provide both coarse and fine tuning. This coarse and fine tuning capability applies to each channel/detector layer of each QWIP structure (pixel) in the FPA. Thus, multimode-multicolor imaging is enabled using a QWIP FPA having detector layers all similarly fabricated (e.g., same asymmetry, semiconductor materials, and doping). The manufacturing process is therefore simplified, and tunable QWIP FPAs are provided. Note, however, that similarly fabricated detector layers is not intended as a limitation on the present invention.

Asymmetric Unit Cell

Figure 9A:
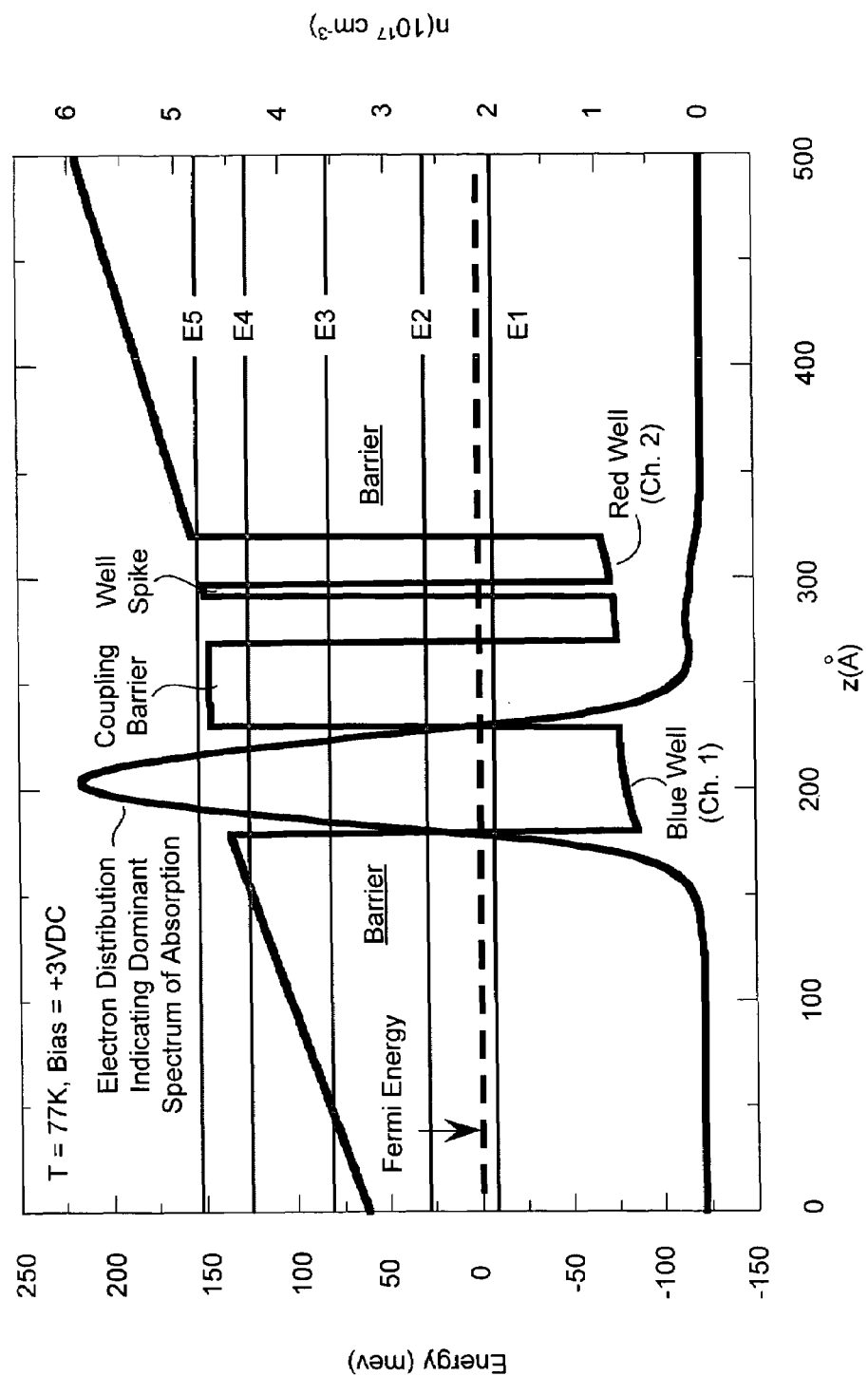
FIGS. 9a and 9b illustrate band diagrams, eigenstates, and electron distribution associated with an asymmetric quantum well structure configured in accordance with another embodiment of the present invention.
Figure 9B:
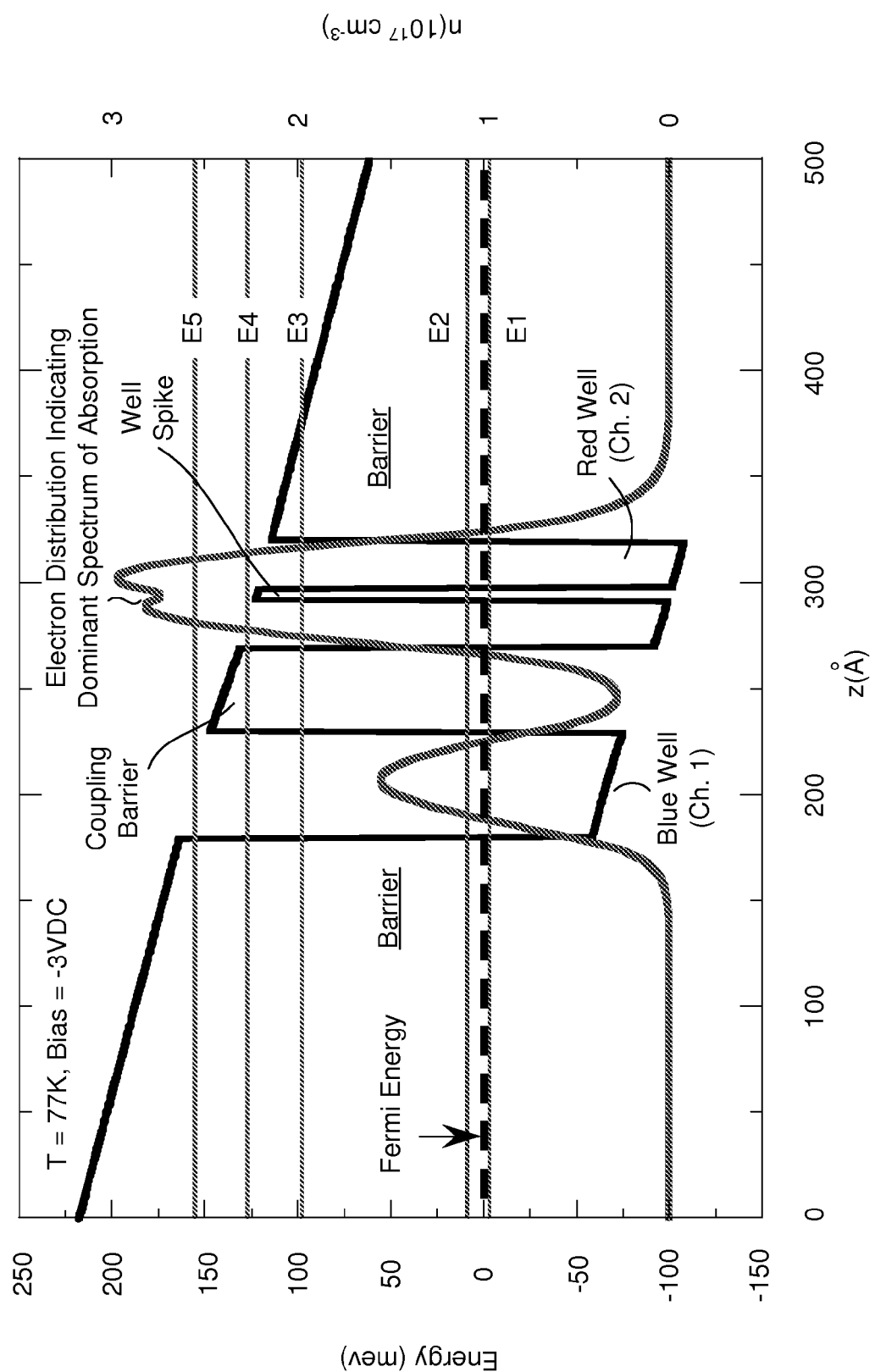

FIGS. 9a and 9b illustrate band diagrams, eigenstates, and electron distribution associated with an asymmetric quantum well structure configured in accordance with another embodiment of the present invention. Here, the asymmetric well is provided by virtue of a unit cell that includes two coupled quantum wells. In particular, the design includes a first quantum well configured to absorb a first spectrum (e.g., blue), a second quantum well configured to absorb a second spectrum (e.g., red), and a coupling barrier between the two wells. Outer barriers sandwich the coupled wells, and the second well includes a well spike.

The "blue" and "red" wells can be, for example, GaAs. Only the red well is doped. The barriers sandwiching the wells can be, for example, $Al_{30\%}Ga_{70\%}As$. The coupling barrier between the wells, and the well spike in the red well can also be $Al_{30\%}Ga_{70\%}As$. The well spike of the red well effectively adjusts the ground state, and not the excited states associated with the red well.

In operation, electron transfer from one well to another takes place when a bias is applied. Only the well which has electrons can absorb light, and therefore contribute to photocurrent. For example, with a positive bias (e.g., +3 VDC), the photocurrent generated in the continuum is dominated by photo-excited electrons from the blue well, which has most of the electrons in it. The blue well peak response might be, for instance, at about 8.6 μm. On the other hand, with a negative bias (e.g., −3 VDC), the photocurrent generated in the continuum is dominated by photo-excited electrons from the red well, which has most of the electrons in it at this bias. The red well peak response might be, for instance, at about 10.0 μm. In such a positive/negative biasing scheme, note that only the downstream well absorbs photons. The lowest two subbands (E1 and E2) are occupied at 77K in this example.

The asymmetry associated with this unit cell structure may cause a small peak in the 7 to 8 μm range, as shown in FIG. 9b. This peak can be filtered out (e.g., using spectrally selective lens) if so desired. As discussed in reference to FIGS. 8a and 8b, the biasing can be manually or automatically set to provide both coarse and fine tuning, which applies to both the blue well (ch. 1) and the red well (ch. 2) of each QWIP structure in the FPA. Thus, multimode or multicolor imaging is enabled using a QWIP FPA having detector layers all similarly or not similarly fabricated (e.g., same asymmetry, semiconductor materials, and doping).

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A tunable quantum well infrared photodetector focal plane array (QWIP FPA) imaging device, comprising:

one or more detector layers including asymmetric quantum wells, each detector layer resides between contact layers and is coupled by barrier layers, thereby defining a stack of layers having a front side and a back side, wherein each detector layer has a spectrum of light absorption that changes in response to an applied bias, each of said asymmetric quantum wells being a unit cell comprising two quantum wells where a first undoped quantum well is configured to absorb a first spectrum, and a second doped quantum well is configured to absorb a second spectrum, wherein said second quantum well includes a well spike and a means for adjusting a ground state of said second quantum well using said well spike without affecting an excited state of said second quantum well, and wherein said means for adjusting is a bias signal;

a light-coupling grating formed on the backside of the stack, the grating having a pattern that reflects a substantial portion of incoming light so as to disperse that light through the one or more of the detector layers, thereby facilitating absorption; and a reflective coating on sides of the detector layers so as to provide, in conjunction with the light-coupling grating, a photon-in-a-box configuration for containing light.

2. The device of claim 1 wherein each detector layer is not more than about one micron in thickness.

3. The device of claim 1 further comprising a read-out integrated circuit (ROIC) that includes biasing circuitry adapted to deliver bias signals to each detector layer thereby enabling tunability of the corresponding spectrum of light absorption.

4. The device of claim 3 wherein each contact layer of the device is electrically coupled to a backside contact, thereby facilitating connection to the ROIC.

5. The device of claim 3 wherein the ROIC further includes an image processor adapted to receive pixel data from each detector layer and to generate corresponding images associated with the pixel data.

6. The device of claim 1 wherein the stack of layers is one multicolor pixel of the device, and is repeated a number of times thereby defining an array of the multicolor pixels.

7. The device of claim 1 wherein applying a first bias causes the first spectrum to be dominant and applying a second bias causes the second spectrum to be dominant.

8. The device of claim 1 wherein applying a first bias causes a first spectrum of absorption to be dominant and applying a second bias causes a second spectrum of absorption to be dominant.

9. A tunable quantum well infrared photodetector focal plane array (QWIP FPA) imaging device, comprising:
   one or more detector layers each including a plurality of asymmetric unit cells, each detector layer between contact layers, thereby defining a stack of layers having a front side and a back side;
   wherein each unit cell includes two quantum wells coupled by a barrier, and one of the quantum wells is undoped and configured to absorb a first spectrum in response to a first bias being applied, and the other quantum well is doped includes a well spike and is configured to absorb a second spectrum in response to a second bias being applied, said well spike having a means for adjusting a ground state of said quantum well configured to absorb the second spectrum without affecting an excited state of said quantum well and wherein said means for adjusting is biasing.

10. The device of claim 9 further comprising a read-out integrated circuit (ROIC) that includes biasing circuitry adapted to deliver the first and second bias signals to each detector layer thereby enabling spectral tunability of the device.

11. The device of claim 10 wherein each contact layer of the device is electrically coupled to a backside contact, thereby facilitating connection to the ROIC.

12. The device of claim 10 wherein the ROIC further includes an image processor adapted to receive pixel data from each detector layer and to generate corresponding images associated with the pixel data.

13. The device of claim 9 wherein the stack of layers is one multicolor pixel of the device, and is repeated a number of times thereby defining an array of the multicolor pixels.

14. A tunable quantum well infrared photodetector focal plane array (QWIP FPA) imaging device, comprising:
   one or more detector layers including asymmetric quantum wells, each detector layer between contact layers, thereby defining a stack of layers having a front side and a back side, wherein each detector layer has a spectrum of light absorption that changes in response to an applied bias;
   a read-out integrated circuit (ROIC) that includes biasing circuitry adapted to deliver bias signals to each detector layer thereby enabling spectral tunability;
   an image processor adapted to receive pixel data from each detector layer and to generate corresponding images associated with the pixel data; and
   wherein each of said asymmetric quantum wells is a unit cell comprising two quantum wells coupled by a barrier, where one of the quantum wells is undoped and configured to absorb a first spectrum, and the other quantum well is doped, includes a well spike and is configured to absorb a second spectrum, said well spike having a means for adjusting the ground state of said quantum well configured to absorb the second spectrum, without affecting an excited state of said quantum well and wherein said means for adjusting is biasing.

15. The device of claim 14 wherein the stack of layers is one multicolor pixel of the device, and is repeated a number of times thereby defining an array of the multicolor pixels, from each of which the image processor receives pixel data.

16. The device of claim 14 wherein applying a first bias causes the first spectrum to be dominant and applying a second bias causes the second spectrum to be dominant.

17. The device of claim 14 wherein applying a first bias causes a first spectrum of absorption to be dominant and applying a second bias causes the second spectrum of absorption to be dominant.

* * * * *